United States Patent
Toba

(10) Patent No.: US 8,178,916 B2
(45) Date of Patent: May 15, 2012

(54) NONVOLATILE SEMICONDUCTOR STORAGE DEVICE

(75) Inventor: Takayuki Toba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/711,512

(22) Filed: Feb. 24, 2010

(65) Prior Publication Data

US 2010/0237399 A1    Sep. 23, 2010

(30) Foreign Application Priority Data

Feb. 24, 2009  (JP) .................................. 2009-040613

(51) Int. Cl.
*H01L 29/772* (2006.01)

(52) U.S. Cl. ............... 257/314; 257/E29.3; 257/E29.309

(58) Field of Classification Search .................. 257/314, 257/315, 324, E29.3, E29.309
See application file for complete search history.

(56) References Cited

U.S. PATENT DOCUMENTS

| 6,411,548 | B1 | 6/2002 | Sakui et al. | |
| 6,835,621 | B2 | 12/2004 | Yoo et al. | |
| 6,917,072 | B2 * | 7/2005 | Noguchi et al. | 257/324 |
| 7,495,284 | B2 * | 2/2009 | Lee | 257/324 |
| 2002/0033501 | A1 | 3/2002 | Sakagami | |
| 2005/0285219 | A1 | 12/2005 | Sakagami | |

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

A semiconductor memory device includes: a semiconductor substrate; a plurality of device isolation regions being disposed in an upper-layer portion of the semiconductor substrate, and dividing the upper-layer portion into a plurality of semiconductor portions extending in a first direction; a plurality of charge storage films which are disposed on one of the plurality of the semiconductor portions and spaced apart from one another in the first direction; a block insulating film disposed covering the plurality of charge storage films; and a word electrode disposed on the block insulating film for each of rows of the plurality of charge storage films arranged in a second direction intersecting the first direction, wherein the block insulating film is disposed continuously in the first direction and in the second direction.

10 Claims, 14 Drawing Sheets height direction memory-string direction height direction memory-string direction height direction memory-string direction height direction memory-string direction height direction memory-string direction height direction memory-string direction

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2009-40613, filed Feb. 24, 2009, the entire contents of which are incorporated herein by reference.

BACKGROUND OF THE INVENTION

1. Field of the Invention

The present invention relates to a nonvolatile semiconductor storage device and a method for manufacturing the same, and particularly to a nonvolatile semiconductor storage device which stores data by storing charges in a charge storage film and a method for manufacturing the same.

2. Description of the Related Art

Conventionally, a NAND flash memory and a NOR flash memory have been widely used as a nonvolatile memory. Further, there has been recently proposed a flash memory having the characteristics of both of the NAND flash memory and the NOR flash memory. As the NAND flash memory, while a memory using a floating gate had been mainly used conventionally, a memory having a metal-oxide-nitride-oxide-silicon (MONOS) structure has been recently developed.

In the NAND flash memory having the MONOS structure, a charge storage film is formed of insulating films, and data is stored by controlling thresholds of memory cell transistors constituting memory cells. Here, the threshold voltages are controlled by injecting charges into trap sites formed in the charge storage film, and by erasing the charges stored in the tarp sites (see, for example, Japanese Patent Application Publication No. Hei 11-312795).

In recent years, to increase capacity and reduce cost of a nonvolatile memory, individual memory cells have been made smaller and smaller. Further shrinking of size of memory cells in the future will shorten spaces between memory cells and may possibly lower their reliability of holding charges. Further, due to shrink size of memory cells, damage caused during processing of each component may adversely affect the characteristics of the memory cells more seriously.

BRIEF SUMMARY OF THE INVENTION

A semiconductor memory device according to an aspect of the present invention includes: a semiconductor substrate; a plurality of device isolation regions being disposed in an upper-layer portion of the semiconductor substrate, and dividing the upper-layer portion into a plurality of semiconductor portions extending in a first direction; a plurality of charge storage films which are disposed on one of the plurality of the semiconductor portions and spaced apart from one another in the first direction; a block insulating film disposed covering the plurality of charge storage films; and a word electrode disposed on the block insulating film for each of rows of the plurality of charge storage films arranged in a second direction intersecting the first direction, wherein the block insulating film is disposed continuously in the first direction and in the second direction.

A method for manufacturing a nonvolatile semiconductor storage device according to an aspect of the present invention includes: a method for manufacturing a nonvolatile semiconductor storage device, comprising the steps of: forming a charge storage film on a semiconductor substrate; forming a plurality of device isolation regions, extending in a first direction, and splitting the charge storage film into a plurality of charge storage films in a second direction intersecting the first direction, and dividing the upper-layer portion into multiple strips of semiconductor portions extending in the first direction; splitting each of the charge storage films into a plurality of charge storage films in the first direction; forming a block insulating film continuously in the first direction and in the second direction in such a manner as to cover the plurality of charge storage films arranged in the first direction and in the second direction; forming a first conductive film on the block insulating film; and splitting the first conductive film in the first direction.

DETAILED DESCRIPTION OF THE INVENTION

Embodiments of the present invention will be described below with reference to the drawings.

A first embodiment of the present invention is described.

Figure 1:
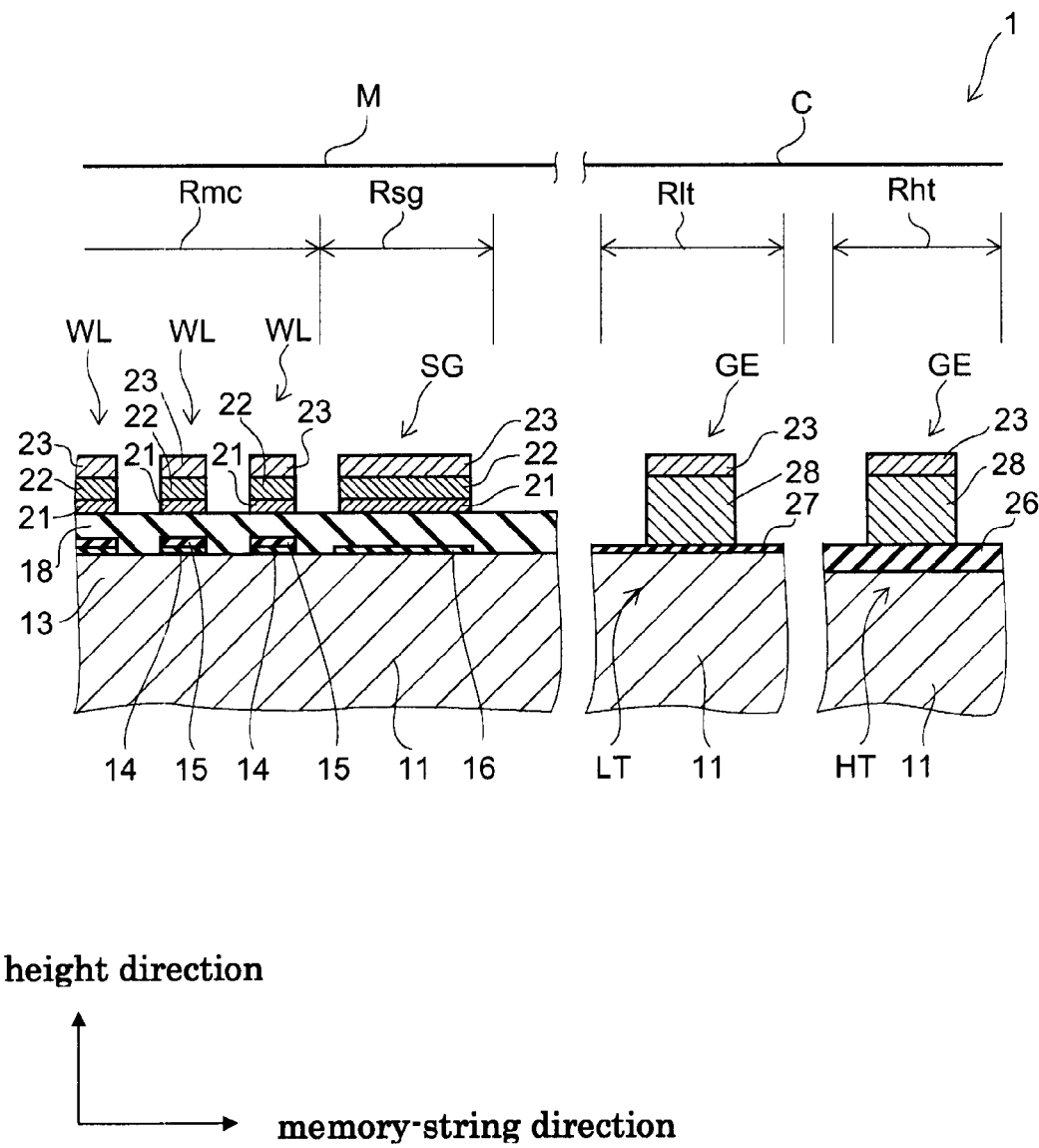
FIG. 1 is a cross-sectional view illustrating a nonvolatile semiconductor storage device according to a first embodiment of the present invention.
Figure 2:
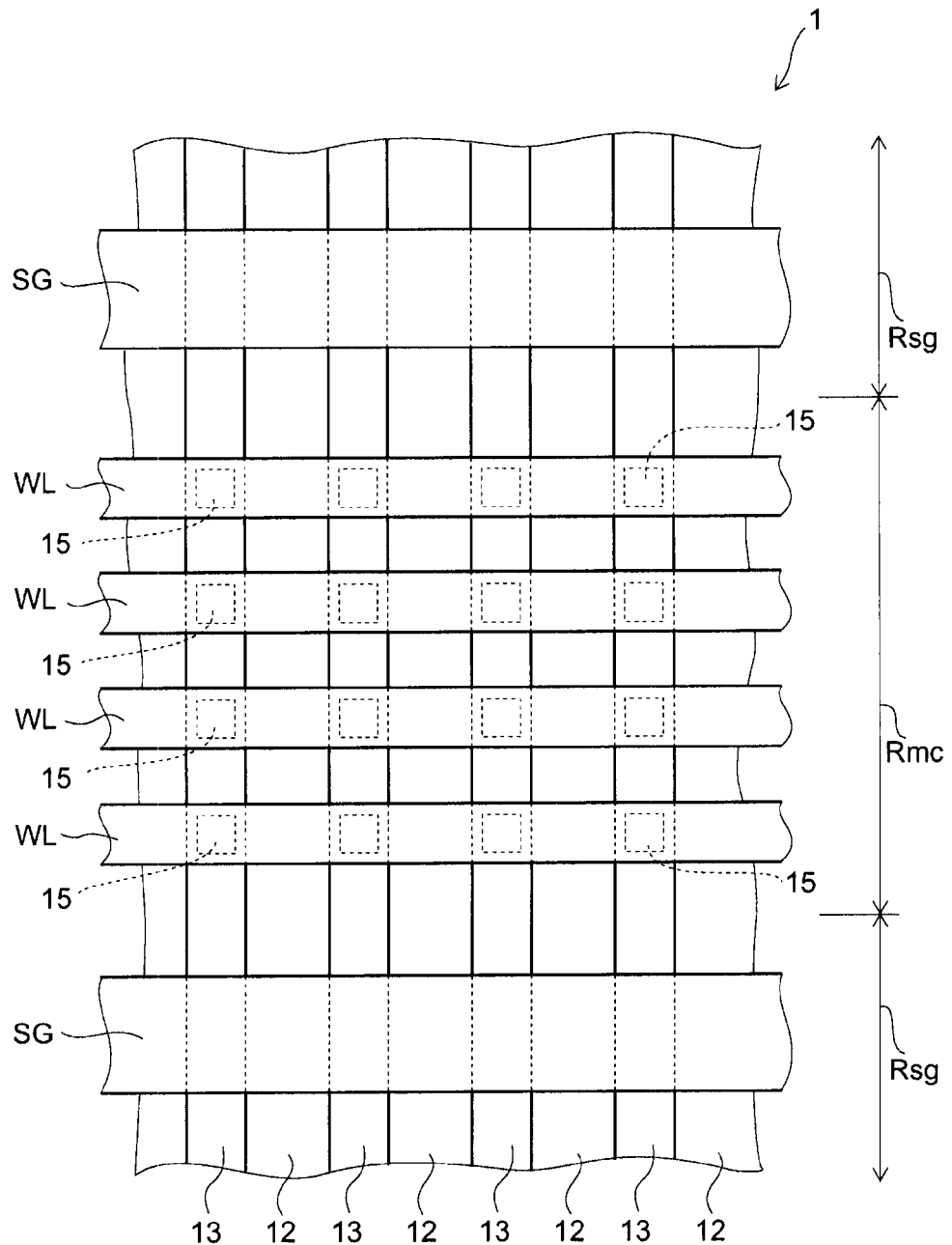
FIG. 2 is a plane view illustrating the nonvolatile semiconductor storage device according to the first embodiment.
Figure 3:
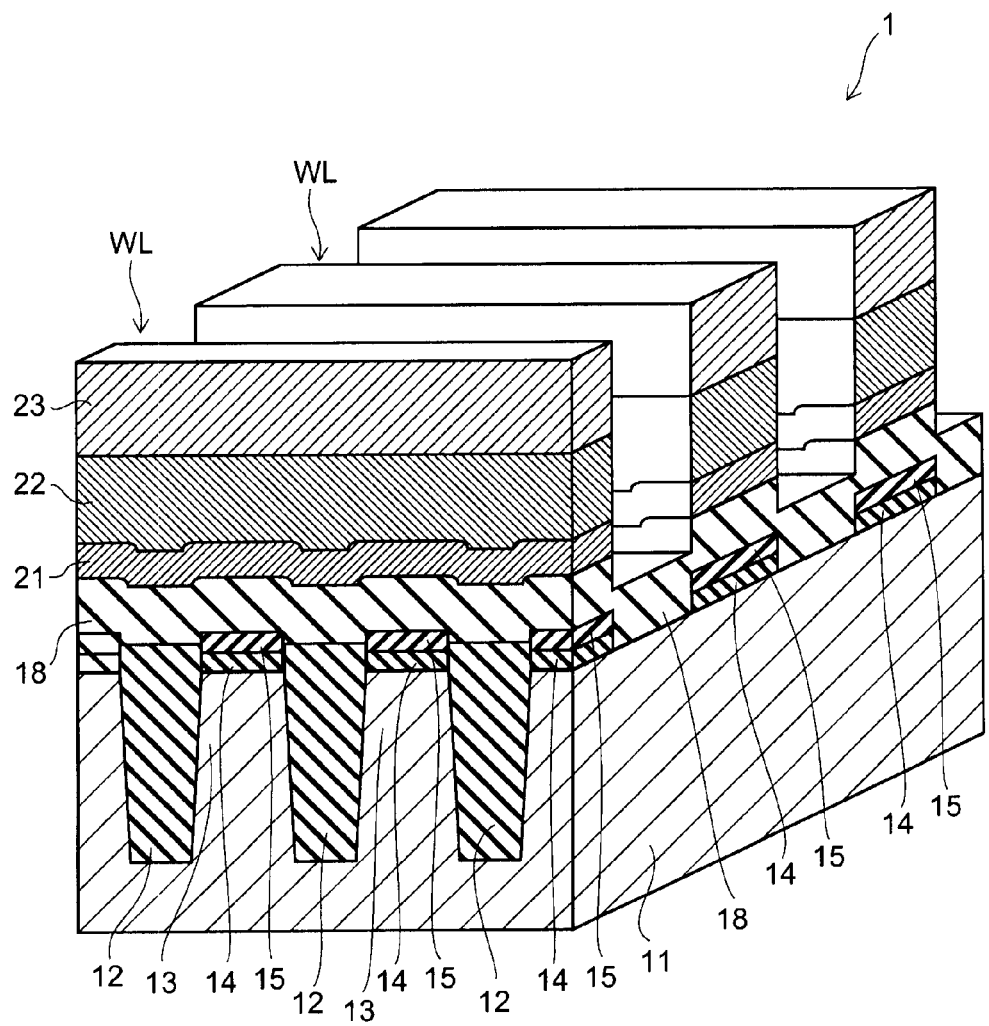
FIG. 3 is a perspective cross-sectional view illustrating the nonvolatile semiconductor storage device according to the first embodiment.
Figure 3:
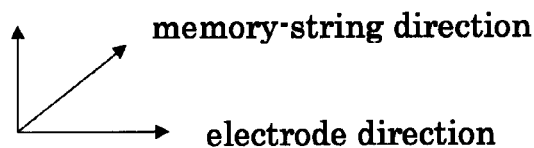

FIGS. 1 to 3 each illustrate a nonvolatile semiconductor storage device according to the present embodiment, and are a cross-sectional view, a plane view, and a perspective cross-sectional view thereof, respectively.

Note that FIG. 2 shows only a memory part of the nonvolatile semiconductor storage device, and FIG. 3 shows only a memory cell region of the memory part. In addition, a block insulating film is not shown in FIG. 2.

As FIG. 1 shows, a nonvolatile semiconductor storage device 1 (also simply called a "device 1" below) according to the present embodiment has a semiconductor substrate 11. The semiconductor substrate 11 is formed of, for example, single-crystal silicon. The device 1 has a memory part M for storing data and a peripheral circuit part C for driving the memory part M, as viewed in a direction perpendicular to a top surface of the semiconductor substrate 11 (called a "height direction" below). The memory part M has a memory cell region Rmc in which memory cell transistors are disposed, and select gate regions Rsg in which select gate transistors are disposed. The select gate regions Rsg sandwich the memory cell region Rmc in one direction parallel to the top surface of the semiconductor substrate 11 (called a "memory-string direction" below).

As FIGS. 1 to 3 show, in the memory part M, device isolation insulating films 12 are embedded in an upper-layer portion of the semiconductor substrate 11 and extend in the memory-string direction. The device isolation insulating films 12 are disposed in such a manner as to connect the paired select gate regions Rsg sandwiching the memory cell region Rmc. The device isolation insulating films 12 function as device isolation regions that divide the upper-layer portion of the semiconductor substrate 11 into multiple strips of semiconductor portions 13 extending in the memory-string direction. As will be described later, the semiconductor portions 13 function as active areas of the device 1. Note that the device isolation regions may be formed of not the device isolation insulating films 12, but semiconductor regions into which high-concentrate impurities are introduced.

Middle portions of the respective semiconductor portions 13 extending in the memory-string direction exist on the memory cell region Rmc of the memory part M. Tunnel insulating films 14 are disposed on a top surface of each of the middle portions of the semiconductor portion 13 in such a manner as to be spaced apart from one another in the memory-string direction. The tunnel insulating films 14 normally exhibit insulating properties, but allow a tunnel current to flow therethrough when a predetermined voltage is applied thereto, the predetermined voltage being within a range of driving voltages of the device 1. The tunnel insulating films 14 are each formed of, for example, a single layer of silicon oxide film or an oxide-nitride-oxide (ONO) film.

A charge storage film 15 is disposed in an area immediately above each tunnel insulating film 14. The charge storage film 15 has a capability of holding a charge, and includes, for example, an electron trap site. For example, the charge storage film 15 is a silicon nitride film. Among directions parallel to the top surface of the semiconductor substrate 11, one that is perpendicular to the memory-string direction is called an "electrode direction" below. The tunnel insulating films 14 and the charge storage films 15 are arranged in a matrix in the memory-string direction and in the electrode direction. Laminated films each formed of the tunnel insulating film 14 and the charge storage film 15 are spaced apart from one another. In the height direction, a top surface of each device isolation insulating film 12 is positioned between a top surface and a bottom surface of each charge storage film 15.

On the other hand, parts of each semiconductor portion 13 that are on both sides of the above-described middle portion exist on the respective select gate regions Rsg of the memory part M. In each select gate region Rsg, a barrier film 16 is disposed in each area immediately above the semiconductor portions 13. The barrier film 16 is formed of, for example, silicon oxide. The tunnel insulating film 14 and the charge storage film 15 are not disposed on the barrier films 16. In other words, the tunnel insulating film 14 and the charge storage film 15 are not disposed in the select gate region Rsg.

Moreover, a block insulating film 18 is disposed on the semiconductor substrate 11 in such manner as to cover the device isolation insulating films 12, the semiconductor portions 13, the tunnel insulting films 14, the charge storage films 15, and the barrier films 16. The block insulating film 18 is not split in the memory part M, but formed continuously over the entire memory part M in a plane manner in the memory-string direction and in the electrode direction. Further, in the memory cell region Rmc, the block insulating film 18 contacts the semiconductor substrate 11 in each area between the laminated films of the tunnel insulating film 14 and the charge storage film 15.

The block insulating film 18 does not substantially allow a current to flow therethrough even when applied with a voltage in the range of driving voltages of the device 1. The block insulating film 18 is made of a high dielectric material, namely, a material having a dielectric constant higher than a material forming the charge storage films 15, which is for example alumina. Although it depends on a film formation method, the relative dielectric constant of silicon nitride forming the charge storage films 15 is, for example, 7, whereas the relative dielectric constant of alumina forming the block insulating film 18 is, for example, 8.5. In addition, the relative dielectric constant of silicon oxide forming the tunnel insulating film 14 is, for example, 3.8.

In the memory cell region Rmc, word electrodes WL extending in the electrode direction are disposed on the block insulating film 18. Each word electrode WL is formed of a laminated film obtained by laminating a metal layer 21, a polysilicon layer 22, and a polysilicon layer 23 in this order. Further, the word electrode WL is disposed for each row of the charge storage films 15 arranged in the electrode direction, among the charge storage films 15 arranged in a matrix. For example, the word electrode WL is formed in such a manner as to connect areas immediately above the respective charge storage films 15 arranged in the electrode direction.

In each of the select gate regions Rsg, a select gate electrode SG extending in the electrode direction is disposed on the block insulating film 18. The select gate electrode SG is disposed in such a manner as to connect parts of areas immediately above the semiconductor portions 13 arranged in the electrode direction. Like the word electrode WL, the select gate electrode SG is also formed by laminating the metal layer 21, the polysilicon layer 22, and the polysilicon layer 23 in this order. In FIG. 1, a top surface of the block insulating film 18 is illustrated as being a plane. However, as FIG. 3 shows, an area immediately below an area between the metal layers 21 in the memory-string direction may sink relative to areas immediately below the metal layers 21.

Meanwhile, as FIG. 1 shows, the peripheral circuit part C has a high-voltage-transistor forming region Rht and a low-voltage-transistor forming region Rlt. A high-voltage transistor HT is in the high-voltage-transistor forming region Rht, and a low-voltage transistor LT is in the low-voltage-transistor disposing region Rlt.

In the high-voltage-transistor forming region Rht, a high-voltage gate insulating film 26 is disposed on the semiconductor substrate 11. Then, a gate electrode GE is disposed on the high-voltage gate insulating film 26. The gate electrode GE is formed by laminating a polysilicon layer 28 and the polysilicon layer 23 in this order. On the other hand, in the low-voltage-transistor disposing region Rlt, a low-voltage gate insulating film 27 is disposed on the semiconductor substrate 11. Then, like the high-voltage transistor HT, another gate electrode GE formed by laminating the polysilicon layer 28 and the polysilicon layer 23 in this order is formed on the low-voltage gate insulating film 27. The low-voltage gate insulating film 27 has a thickness smaller than the high-voltage gate insulating film 26. In FIG. 1, the gate electrodes GE are illustrated as extending in the electrode direction. However, the gate electrodes GE may extend in the memory-string direction.

Moreover, diffusion layers SD are formed on a surface of the semiconductor substrate 11 in such a manner as to sandwich the gate electrodes GE in the memory-string direction. The diffusion layers SD function as source and drain, respectively.

Then, an interlayer insulating film (not shown) is disposed covering the word electrodes WL, the select gate electrodes SG, and the gate electrodes GE. The interlayer insulating film is made of, for example, silicon oxide. Further, a contact is disposed in the interlayer insulating film, and wiring is disposed on the interlayer insulating film.

In the nonvolatile semiconductor storage device 1 according to the present embodiment, as viewed in the height direction, the laminated film formed of the tunnel insulating film 14, the charge storage film 15, and the block insulating film 18 is disposed in each intersection between the semiconductor portions 13 extending in the memory-string direction and the word electrodes WL extending in the electrode direction. Further, the semiconductor portions 13 function as active areas, and the word electrodes WL function as gate electrodes. Thereby, memory cell transistors of a Metal-Alumina-Nitride-Oxide-Silicon (MANOS) type are disposed. Memory strings includes each serially connecting the memory cell transistors sharing the same semiconductor portion 13. Although the number of memory cells constituting a single memory string is four in FIG. 2, the present embodiment is not limited to this number.

Further, as viewed in the height direction, the laminated film formed of the barrier film 16 and the block insulating film 18 is disposed in each intersection between the semiconductor portions 13 and the select gate electrodes SG. The semiconductor portions 13 function as channels. Further, the laminated films formed of the barrier film 16 and the block insulating film 18 each function as a gate insulating film. Moreover, the select gate electrodes SG each function as a gate electrode. As a result, select gate transistors are formed. Accordingly, the select gate transistors are connected at each end of the memory strings.

Meanwhile, the high-voltage transistor HT and the low-voltage transistor LT are included in the periphery circuit that drives the above-described memory cells. The periphery circuit supplies a predetermined driving voltage to the semiconductor portions 13, the word electrodes WL, and the select gate electrodes SG.

Next, a method for manufacturing the nonvolatile semiconductor storage device 1 according to the present embodiment is described.

FIGS. 4 to 9 are each a cross-sectional view illustrating a step in the method for manufacturing the nonvolatile semiconductor storage device according to the present embodiment. FIG. 7A shows a cross section parallel to the memory-string direction, and FIG. 7B shows a cross section parallel to the electrode direction.

Figure 4:
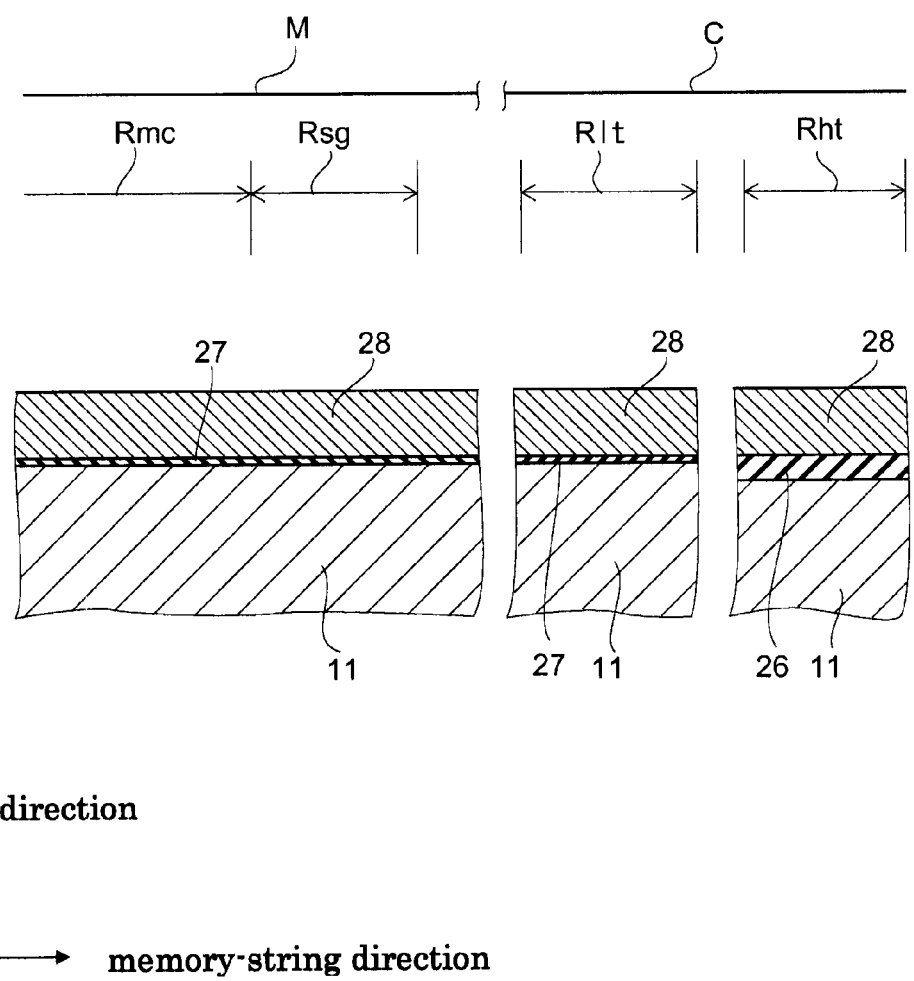
FIG. 4 is a cross-sectional view illustrating a step in a method of manufacturing the nonvolatile semiconductor storage device according to the first embodiment.

As FIG. 4 shows, the semiconductor substrate 11 is prepared. The semiconductor substrate 11 is, for example, a silicon wafer. A sacrifice oxide film (not shown) is formed on the top surface of the semiconductor substrate 11. Predetermined impurities are then introduced into a predetermined area in each of the memory part M and the peripheral circuit part C to thereby selectively form wells (not shown) in an upper layer portion of the semiconductor substrate 11.

The sacrifice oxide film is removed. The upper-layer portion of the semiconductor substrate 11 where the high-voltage gate insulating film 26 for the high-voltage transistor HT is to be formed is selectively removed by reactive ion etching (RIE). As a result, the semiconductor substrate 11 in the high-voltage-transistor forming region Rht sinks relative to any other regions.

The high-voltage gate insulating film 26 is formed on the entire top surface of the semiconductor substrate 11. The high-voltage gate insulating film 26 is patterned, and is removed from the memory part M and the low-voltage-transistor forming region Rlt and left in the high-voltage-transistor forming region Rht. The low-voltage gate insulating film 27 is formed in an area in the top surface of the semiconductor substrate 11, where the high-voltage gate insulating film 26 is not formed. Here, the low-voltage gate insulating film 27 is formed thinner than the high-voltage gate insulating film 26. The polysilicon layer 28 is formed on the entire surface.

Figure 5:
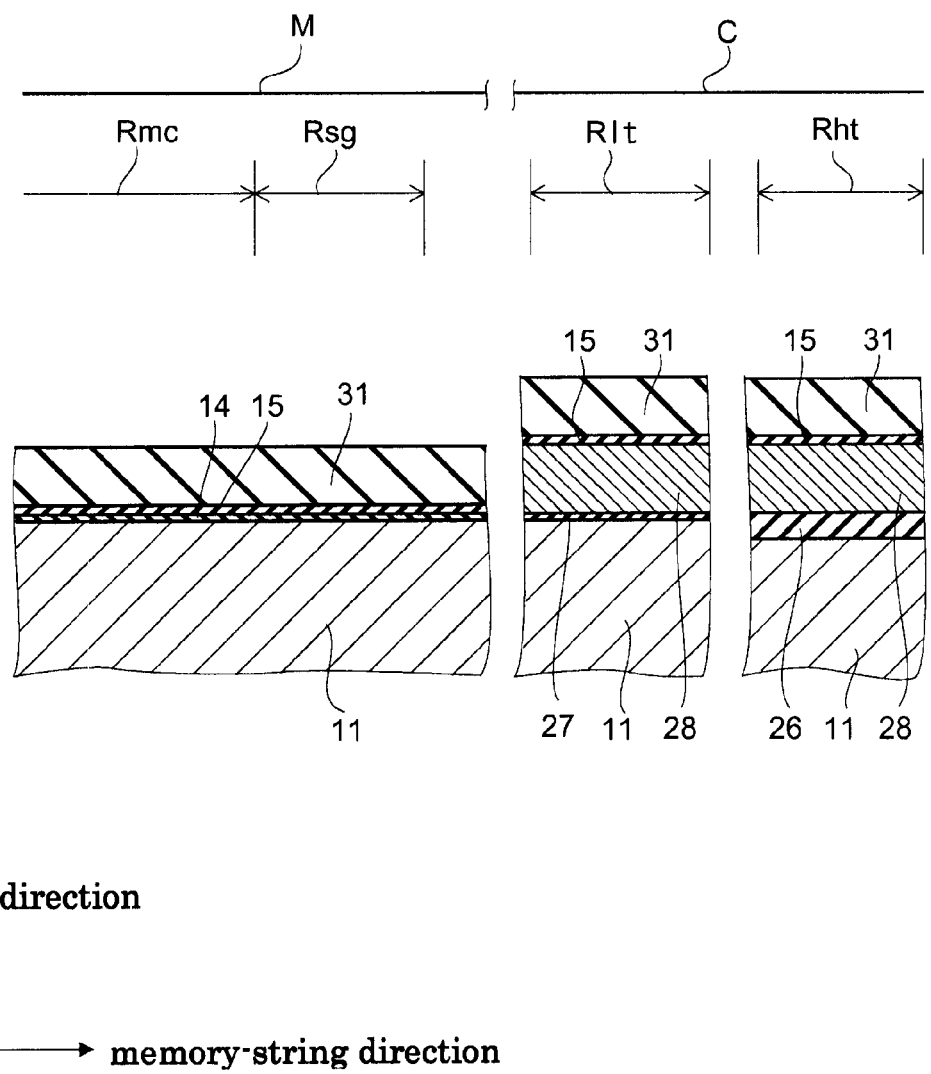
FIG. 5 is a cross-sectional view illustrating a step in the method of manufacturing the nonvolatile semiconductor storage device according to the first embodiment.

As FIG. 5 shows, the polysilicon layer 28 and the low-voltage gate insulating film 27 are removed from the memory part M. As a result, the high-voltage gate insulating film 26 and the polysilicon layer 28 are left in the high-voltage-transistor forming region Rht, and the low-voltage gate insulating film 27 and the polysilicon layer 28 are left in the low-voltage-transistor forming region Rlt. In the memory part M, the semiconductor substrate 11 is exposed.

The tunnel insulating film 14 made of silicon oxide is formed on the top surface of the semiconductor substrate 11 in the memory part M by a thermal oxidation process. On the entire surface of the semiconductor substrate 11, the charge storage film 15 is formed through deposition of, for example, silicon nitride, and a mask 31 is formed through deposition of, for example, silicon oxide, silicon nitride, or amorphous silicon.

Figure 6:
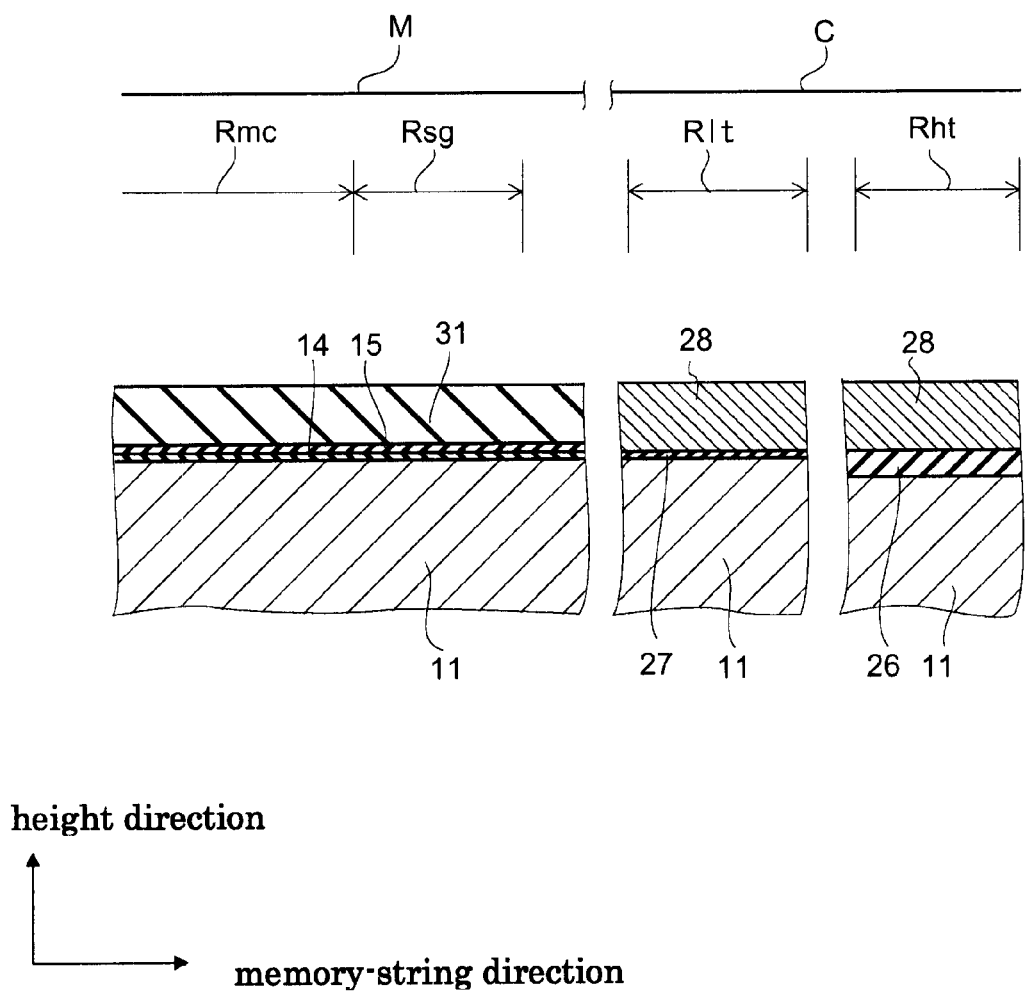
FIG. 6 is a cross-sectional view illustrating a step in the method of manufacturing the nonvolatile semiconductor storage device according to the first embodiment.
Figure 7A:
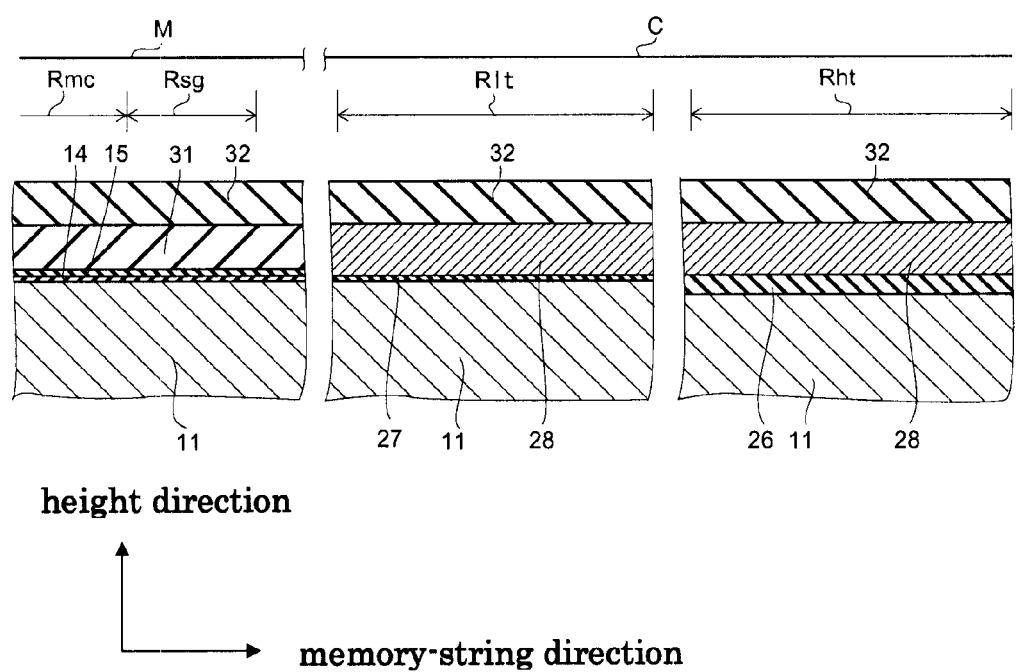
FIG. 7A is a cross-sectional view illustrating a step in the method of manufacturing the nonvolatile semiconductor storage device according to the first embodiment, and shows a cross section parallel to a memory-string direction.
Figure 7B:
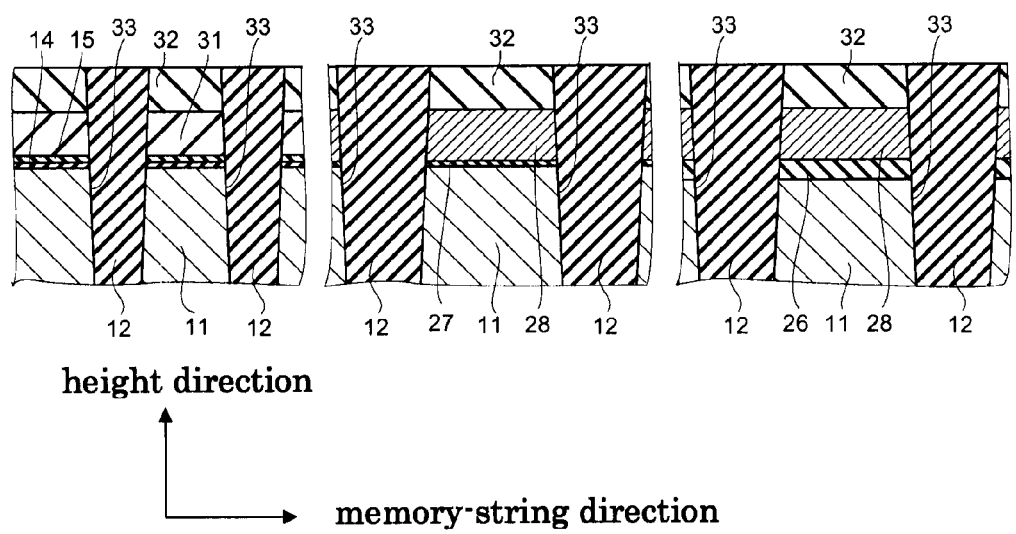
FIG. 7B is a cross-sectional view illustrating a step in the method of manufacturing the nonvolatile semiconductor storage device according to the first embodiment, and shows a cross section parallel to an electrode direction.

As FIG. 6 shows, by selective RIE, the mask 31 and the charge storage film 15 are removed from the peripheral circuit part C and left in the memory part M. As FIGS. 7A and 7B show, a mask 32 for device isolation is formed on the entire surface. The mask 32 in the memory part M is patterned using lithography so as to form an opening at an area where the device isolation insulating film 12 is to be formed. The charge storage film 15, the tunnel insulating film 14, and an upper-layer portion of the semiconductor substrate 11 is selectively removed by RIE using the mask 32 as a mask. Thereby, multiple grooves 33 extending in the memory-string direction are formed in the memory part M. An insulating material such as silicon oxide is embedded in each of these grooves 33. The top surface is planarized by chemical mechanical polishing (CMP) using the mask 32 as a stopper.

As a result, multiple strips of the device isolation insulating films 12 extending in the memory-string direction are formed in the charge storage film 15, the tunnel insulating film 14 and the upper-layer portion of the semiconductor substrate 11. As a consequence, the charge storage film 15 and the tunnel insulating film 14 are each split in the electrode direction to be stripes extending in the memory-string direction. Further, the upper-layer portion of the semiconductor substrate 11 is also split in the electrode direction to be divided into multiple strips of the semiconductor portions 13 extending in the memory-string direction.

At this stage, the position of a top surface of each device isolation insulating film 12 in the height direction is almost equal to a top surface of the mask 32. Each device isolation insulating film 12 is etched so that the top surface thereof sinks to a level below a top surface of the charge storage film 15 and higher than an interface between the charge storage film 15 and the tunnel insulating film 14.

Figure 8:
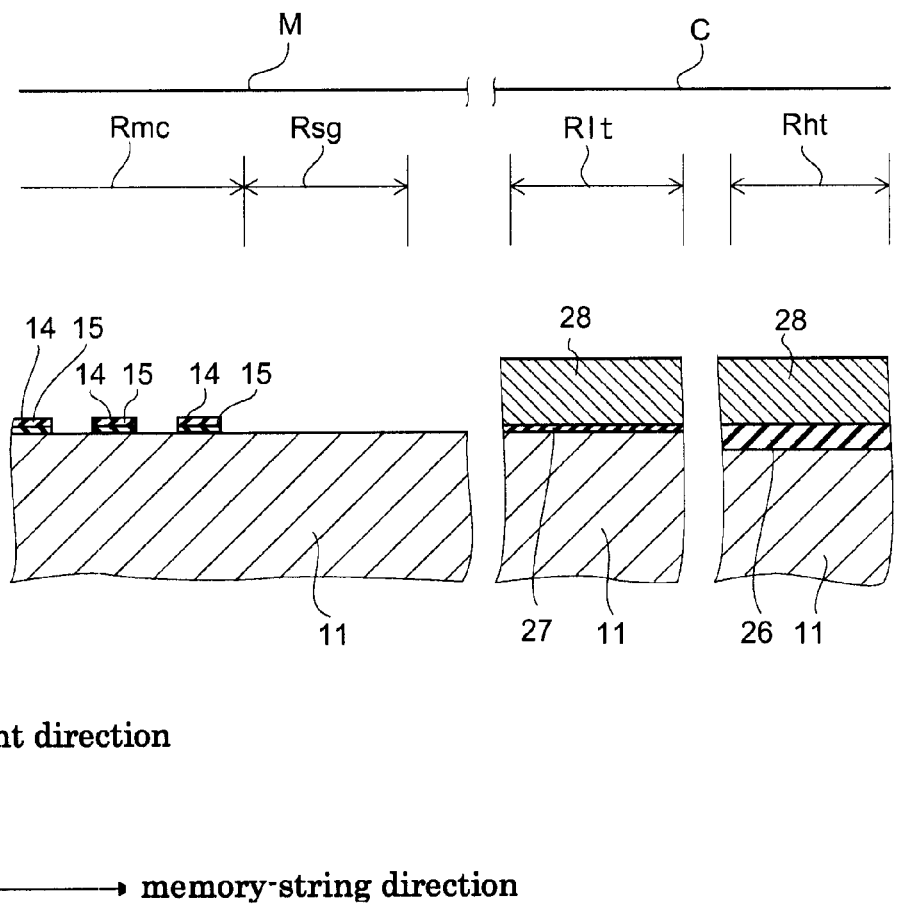
FIG. 8 is a cross-sectional view illustrating a step in the method of manufacturing the nonvolatile semiconductor storage device according to the first embodiment.

As FIG. 8 shows, the mask 32 (see FIGS. 7A and 7B) is removed. A predetermined mask pattern (not shown) is formed on the mask 31, and RIE is performed using the mask 31 as a mask. Thereby, the charge storage films 15 and the tunnel insulating films 14 left together on the semiconductor portions 13 are split at regular intervals in the memory-string direction or at predetermined intervals. As a result, laminated films of the tunnel insulating film 14 and the charge storage film 15 are split in the electrode direction and the memory-string direction to be arranged in a matrix. Thereafter, the mask 31 is removed.

Figure 9:
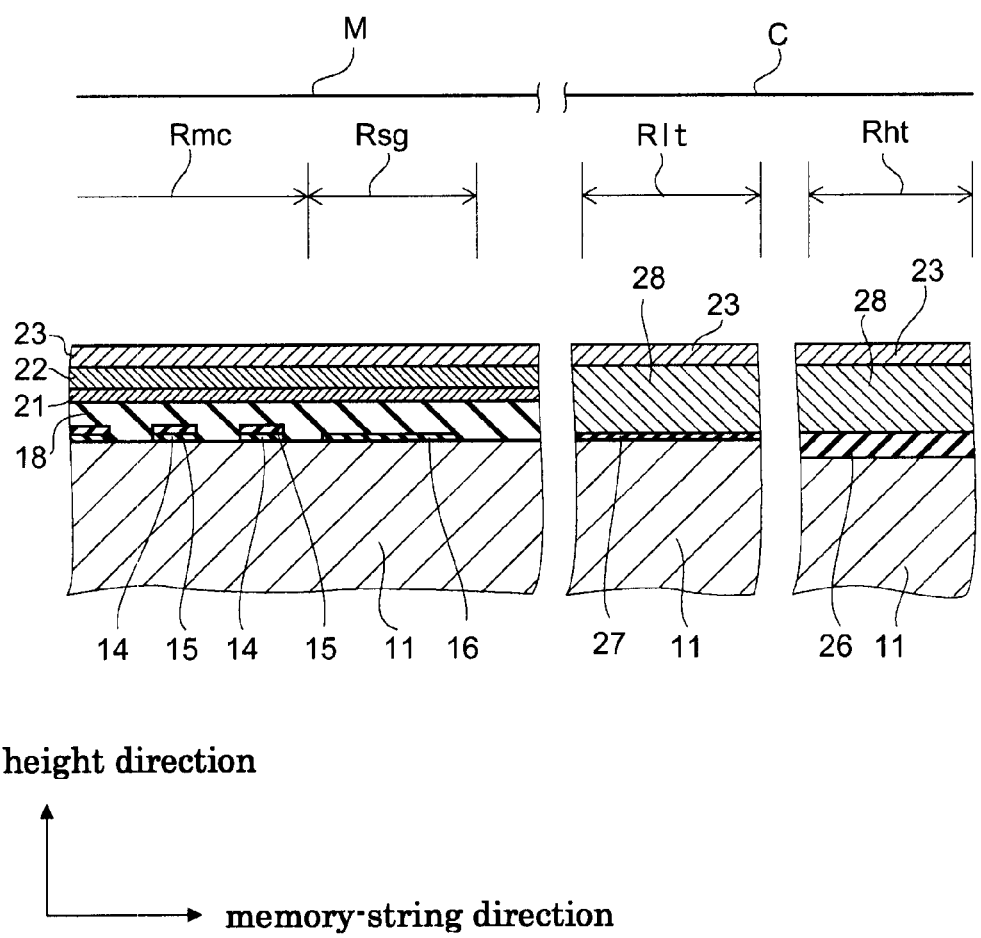
FIG. 9 is a cross-sectional view illustrating a step in the method of manufacturing the nonvolatile semiconductor storage device according to the first embodiment.

As FIG. 9 shows, the barrier films 16 are formed on the semiconductor substrate 11 in the select gate region Rsg through deposition of, for example, silicon oxide. On the entire memory part M, the block insulating film 18 is formed covering the charge storage films 15 and the barrier films 16. The block insulating film 18 is formed continuously in a plane manner in the memory-string direction and in the electrode direction. The block insulating film 18 is made of a high dielectric material having a dielectric constant higher than a material forming the charge storage film 15, which is, for example, alumina. The block insulating film 18 may have an uneven top surface in which areas immediately above the charge storage films 15 and the barrier films 16 are high relative to other areas.

The metal layer 21 and the polysilicon layer 22 are formed in this order on the entire surface. Thereafter, a mask pattern (not shown) that covers the memory part M and exposes the peripheral circuit part C is formed. The polysilicon layer 22, the metal layer 21, and the block insulating film 18 are removed from the peripheral circuit part C and to leave them in the memory part M by RIE using the mask pattern as a mask. The polysilicon layer 23 is formed on the entire surface.

As shown in FIGS. 1 to 3, a mask pattern (not shown) is formed, which covers multiple strips of stripe areas each corresponding to a row of the charge storage films 15 arranged in the electrode direction in the memory part M, a pair of stripe areas sandwiching those stripe areas, and areas other than the memory part M, and which exposes other areas. The polysilicon layer 23, the polysilicon layer 22, and the metal layer 21 is selectively removed using this mask pattern as a mask. Note that the block insulating film 18 is not etching here. However, the metal layer 21 has to be split completely, and therefore processing of the metal layer 21 may inevitably process an upper-layer portion of the block insulating film 18.

By this processing, the word electrodes WL each formed of a laminated film of the metal layer 21, the polysilicon layer 22, and the polysilicon layer 23 are formed on the block insulating film 18 in the memory cell region Rmc of the memory part M. Each word electrode WL extends in the electrode direction and corresponds to a row of the charge storage films 15 arranged in the electrode direction. In addition, the select gate electrodes SG are formed on the block insulating film 18 in the respective select gate regions Rsg. Each select electrode SG is formed of the same laminated film as that described above and extends in the electrode direction.

A mask pattern (not shown) is formed, which covers areas in the peripheral circuit part C where the gate electrodes GE of the high-voltage transistor HT and the low voltage transistor LT are to be formed, and areas other than the peripheral circuit part C, and which exposes other areas. The polysilicon layer 23 and the polysilicon layer 28 are etched using this mask pattern as a mask. Thereby, the gate electrodes GE are formed in the peripheral circuit part C. Each gate electrode GE is formed of a laminated film of the polysilicon layer 28 and the polysilicon layer 23.

The diffusion layers SD are formed, through ion implantation, on a surface of semiconductor substrate 11 by using the gate electrodes GE as a mask. Note that the diffusion layers SD can be formed, through ion implantation, on a surface of semiconductor substrate 11 by using the word electrodes WL and the select gate electrodes SG as a mask.

Note that the gate electrodes GE may be formed at the same time when the word electrodes WL and the select gate electrodes SG are formed. Specifically, a common mask pattern for forming the word electrodes WL, the select gate electrodes SG, and the gate electrodes GE at once is formed. Using this mask pattern as a mask, the polysilicon layer 23, the polysilicon layer 22, the metal layer 21, and the polysilicon layer 28 may be processed. The difference between the layer structure of the word electrode WL and of the select gate electrode SG and the layer structure of the gate electrode GE in terms of material is the metal layer 21. Accordingly, the word electrodes WL, the select gate electrodes SG, and the gate electrodes GE can be formed simultaneously if an etching condition is high etching selectivity between the metal layer 21 and the low-voltage and high-voltage gate insulating films 27 and 26. Such simultaneous formation can reduce the number of manufacturing steps.

Through deposition of, for example, silicon oxide, an interlayer insulating film (not shown) is formed covering the word electrodes WL, the select gate electrodes SG, and the gate electrodes GE. A contact is formed in this interlayer insulating film, and wiring is formed on the interlayer insulating film. If a silicon wafer is used as the semiconductor substrate 11, the silicon wafer is diced into chips. Thereby, the nonvolatile semiconductor storage device 1 according to the present embodiment is manufactured.

Operations and effects of the present embodiment are described.

Figure 10A:
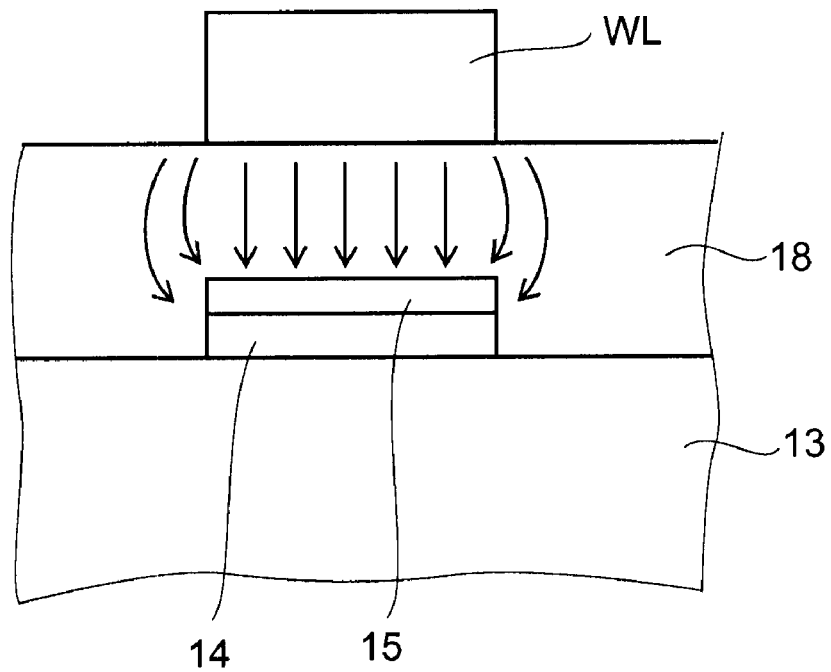
FIG. 10A is a schematic cross-sectional view showing the first embodiment to illustrate effects of the first embodiment.
Figure 10B:
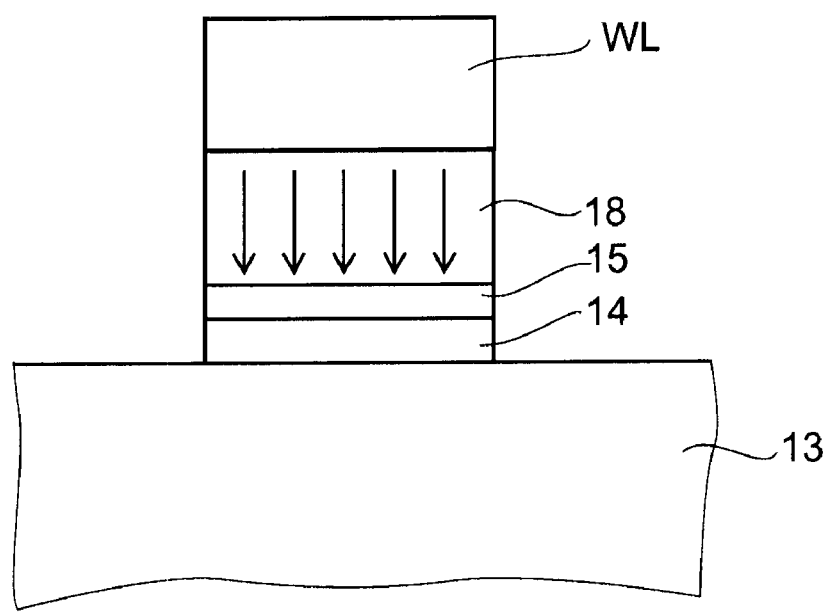
FIG. 10B is a schematic cross-sectional view showing a comparative example to illustrate effects of the first embodiment.

FIGS. 10A and 10B are schematic cross-sectional views illustrating the effects of the present embodiment, and show the present embodiment and a comparative example, respectively.

Figure 11:
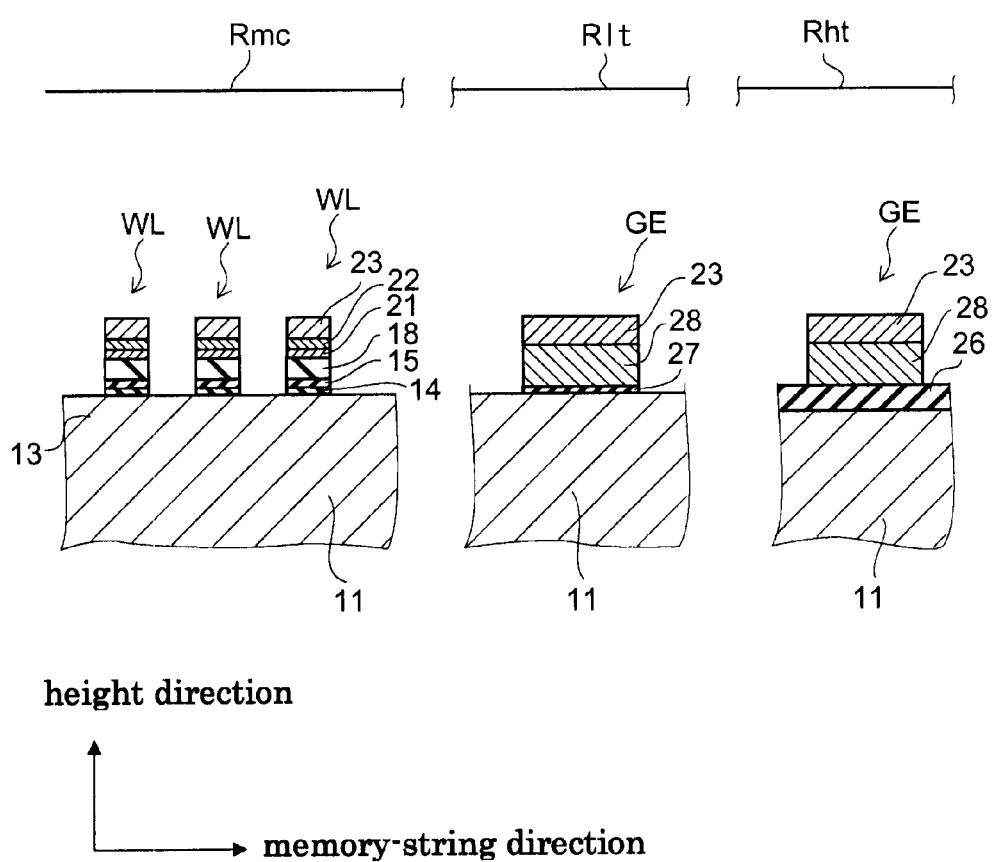
FIG. 11 is a cross-sectional view illustrating a nonvolatile semiconductor storage device according to the comparative example.

FIG. 11 is a cross-sectional view illustrating a nonvolatile semiconductor storage device according to the comparative example.

In the nonvolatile semiconductor storage device 1 according to the present embodiment, the charge storage film 15 is split for each memory cell. Accordingly, charges do not undergo hopping conduction from a trap site in the charge storage film 15 to a trap site in an interface between the tunnel insulating film 14 and the charge storage film 15. Consequently, there is a low possibility for charges stored in the charge storage film 15 to move to an adjacent memory cell. For this reason, high reliability for charge storage can be obtained even when a size of the memory cells is shrinking.

Further, in the device 1, side surfaces and a top surface of each charge storage film 15 is covered by the block insulating film 18 which is formed of a high dielectric material having a dielectric constant higher than that forming the charge storage film 15. For example, the charge storage film 15 is formed of silicon nitride, and the block insulating film 18 is formed of alumina.

Accordingly, as FIG. 10A shows, an electric field formed between the word electrode WL and the semiconductor portion 13 extends outside of a space between the word electrode WL and the charge storage film 15, causing the electric field to be applied to the charge storage film 15 evenly. This allows charges to be evenly introduced into and erased from the charge storage film 15, which allows satisfactory utilization of the charge storage capability of the charge storage film 15. As a result, a sufficient amount of charge storage can be obtained even when the size of the memory cells is shrinking.

In contrast, in the comparative example shown in FIG. 11, the block insulating film 18 is formed only in an area immediately above the charge storage film 15. In this case, as FIG. 10B shows, an electric field formed between the word electrode WL and the semiconductor portion 13 is unlikely to extend outside of a space between the word electrode WL and the charge storage film 15, so that an electric field applied to an edge portion of the charge storage film 15 is weak. This is noticeable when a material, such as silicon oxide, having a dielectric constant lower than that forming the charge storage film 15 is embedded in the peripheral of the block insulating film 18 and the charge storage film 15.

When the electric field applied to the edge portion of the charge storage film 15 is weak, insufficient charges are introduced into the edge portion. Since the charge storage film 15 is an insulating film, a charge in the charge storage film 15 has low mobility. Accordingly, when the amount of charges written into and erased from the charge storage film 15 is unbalanced, the amount of charge storage becomes unbalanced, too. For this reason, when the amount of charges introduced into the edge portion of the charge storage film 15 is small, the amount of charges stored in the edge portion is also small. This lowers the overall effective capability of the charge storage film 15 to store charges, causing troubles such as a program and erase speed is slow and a reduction in the effective gate length. Such troubles become more noticeable when the size of the memory cells is shrinking. In contrast, according to the present embodiment, an electric field is applied evenly to the entire charge storage film 15, allowing the charge storage capability of the charge storage film 15 to be used effectively.

Moreover, in the present embodiment, the charge storage films 15 are not disposed in the select gate regions Rsg, and are therefore not formed between the semiconductor portions 13 and the select gate electrodes SG. Accordingly, in the select gate regions Rsg, no charge is stored in the charge storage films 15, causing no fluctuation of a threshold of the select gate transistors, which would occur if charges were stored.

Furthermore, in the present embodiment, the gate insulating film for the select gate transistors includes the block insulating film 18 having a high dielectric constant. As a result, the characteristics of the select gate transistors can be improved.

Moreover, in the present embodiment, the block insulating film 18 is not etched when the polysilicon layer 23, the polysilicon layer 22, and the metal layer 21 are etched to form the word electrodes WL and the select gate electrodes SG. For this reason, damage, which would be caused if the block insulating film 18 were etched, is not introduced into the charge storage film 15. Further, such damage of the block insulating film 18 is not applied to the semiconductor substrate 11, either. Accordingly, such damage would not affect the characteristics of the memory cells. For example, damage applied to the semiconductor portions 13 of the semiconductor substrate 11 would not reduce cell currents flowing through the semiconductor portions 13. In general, when the size of the memory cells is shrinking, an etching area increases per unit volume. Accordingly, influence of damage applied to the memory cells increases, as well. For these reasons, the effects of the present embodiment are particularly effective when the size of the memory cells is shrinking.

Furthermore, if the block insulating film 18 and the charge storage film 15 are split at the same time when the word electrodes WL and the select gate electrodes SG are formed, damage due to the splitting processing is applied to edge portions of the charge storage films 15, and thereby the retention characteristics of the charge storage films 15. In contrast, in the present embodiment, the charge storage film 15 is processed in a different step from that for forming the word electrodes WL and the select gate electrodes SG. Accordingly, the charge storage film 15 can be processed under a condition most appropriate for the charge storage film 15, such as using a low power. Thereby, damage applied to the charge storage films 15 can be reduced, improving the reliability of the charge storage films 15.

Moreover, processing alumina is generally difficult. For this reason, it is difficult to perform processing that meets all the conditions of a high selective ratio, good controllability for taper angles, less damage to the processing surface, and the like. However, in the present embodiment, the block insulating film 18 need not be processed. Accordingly, even if the block insulating film 18 is made of alumina, the device 1 can be manufactured easily.

As described thus far, according to the present embodiment, the charge storage film 15 is split for each memory cell before forming the block insulating film 18. Then, the block insulating film 18 made of a high dielectric material is formed covering the charge storage films 15. Thereafter, when the word electrodes WL and others are formed, the block insulating film 18 is not etched. Consequently, moving charges between the charge storage films 15 is prevented, and there is less damage caused by the formation of the word electrodes WL and others. Accordingly, a nonvolatile semiconductor storage device in which an electric field can be evenly applied to the charge storage films 15 can be manufactured easily. Consequently, a nonvolatile semiconductor storage device can be obtained, which has high charge-storage reliability and good memory-cell characteristics even when the size of the memory cells is shrinking.

Next, a second embodiment of the present invention is described.

Figure 12:
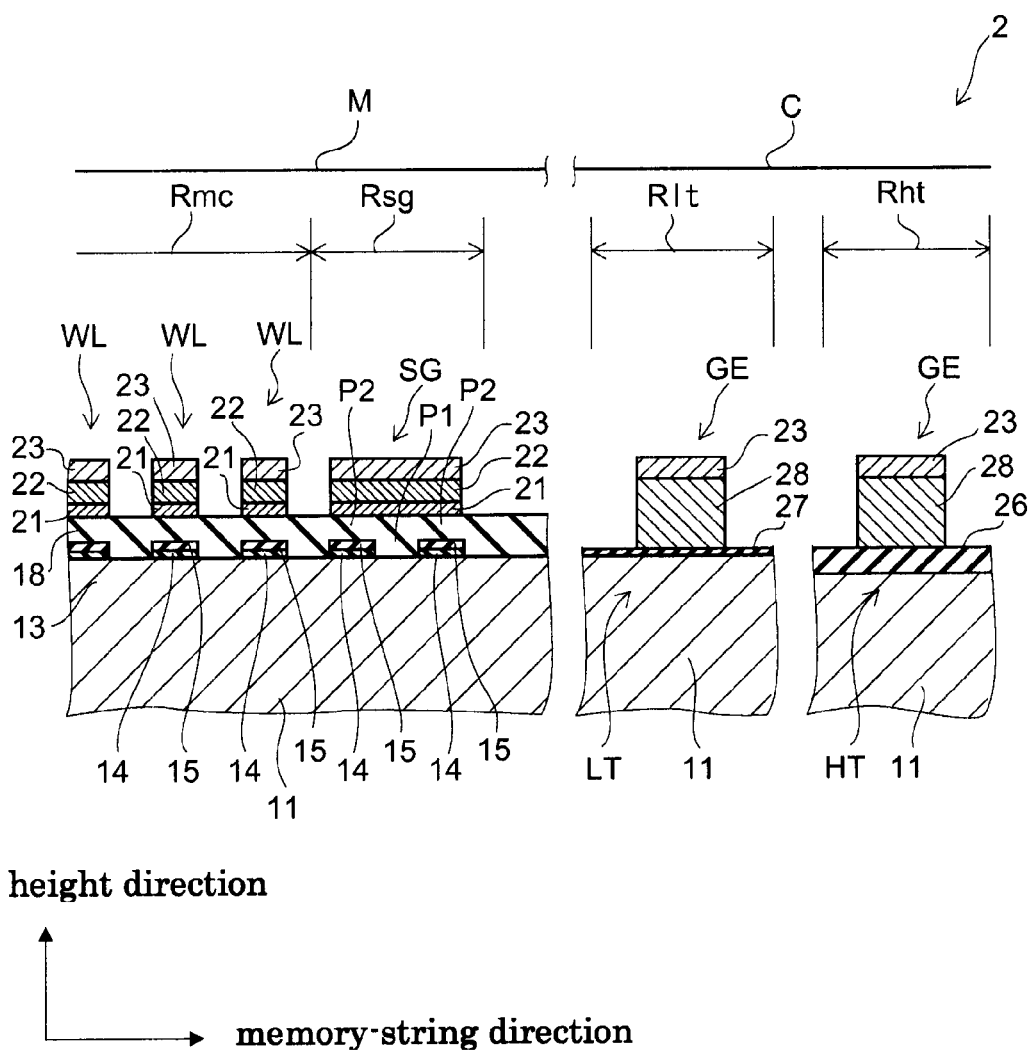
FIG. 12 is a cross-sectional view illustrating a nonvolatile semiconductor storage device according to a second embodiment of the present invention.

FIG. 12 is a cross-sectional view illustrating a nonvolatile semiconductor storage device according to the present embodiment.

As FIG. 12 shows, in a nonvolatile semiconductor storage device 2 according to the present embodiment, the tunnel insulating films 14 and the charge storage films 15 are disposed in the select gate region Rsg, as well. In other words, the charge storage films 15 are formed also between the semiconductor portions 13 and the select gate electrodes SG. The charge storage films 15 formed in both of the memory cell region Rmc and the select gate regions Rsg are arranged at regular intervals in the memory-string direction and in the electrode direction.

In each of the select gate regions Rsg, laminated films each formed of the tunnel insulating film 14 and the charge storage film 15 that are obtained by split are formed on the semiconductor portions 13. Then, the block insulating film 18 is disposed covering those laminated films. Here, the block insulating film 18 has first portions P1 in direct contact with the semiconductor portions 13 and second portions P2 in contact with the top surfaces of the charge storage films 15. The select gate electrodes SG are formed on the first portions P1 and the second portions P2 of the block insulating film 18. The select gate electrodes SG have the same electrode structure as the word electrodes WL.

In the present embodiment, the charge storage films 15 are disposed at regular intervals in both of the memory cell region Rmc and the select gate region Rsg. This makes patterning for the charge storage films 15 easy.

In addition, in the present embodiment, the tunnel insulating films 14 and the charge storage films 15 are formed only in part of areas immediately below the select gate electrodes SG, namely, only in areas immediately below the second portions P2 of the block insulating film 18. Thereby, compared to the case where the tunnel insulating films 14 and the charge storage films 15 are disposed in the entire area below the select gate electrode SG, the overall gate insulating film can have a higher dielectric constant. This is because the block insulating film 18 having a dielectric constant higher than the charge storage film 15 exists between the laminated films of the tunnel insulating film 14 and the charge storage film 15. To be more specific, the electrical thickness of the gate insulating film is made smaller in the first portion P1 because the block insulating film 18 having a dielectric constant higher than the charge storage film 15 partially replaces the laminated film of the tunnel insulating film 14 and the charge storage film 15. As a result, the characteristics of the select gate transistors can be improved even more. Configurations, operations, and effects of the present embodiment other than those described above are the same as the first embodiment.

Next, a modification of the present embodiment is described.

Figure 13:
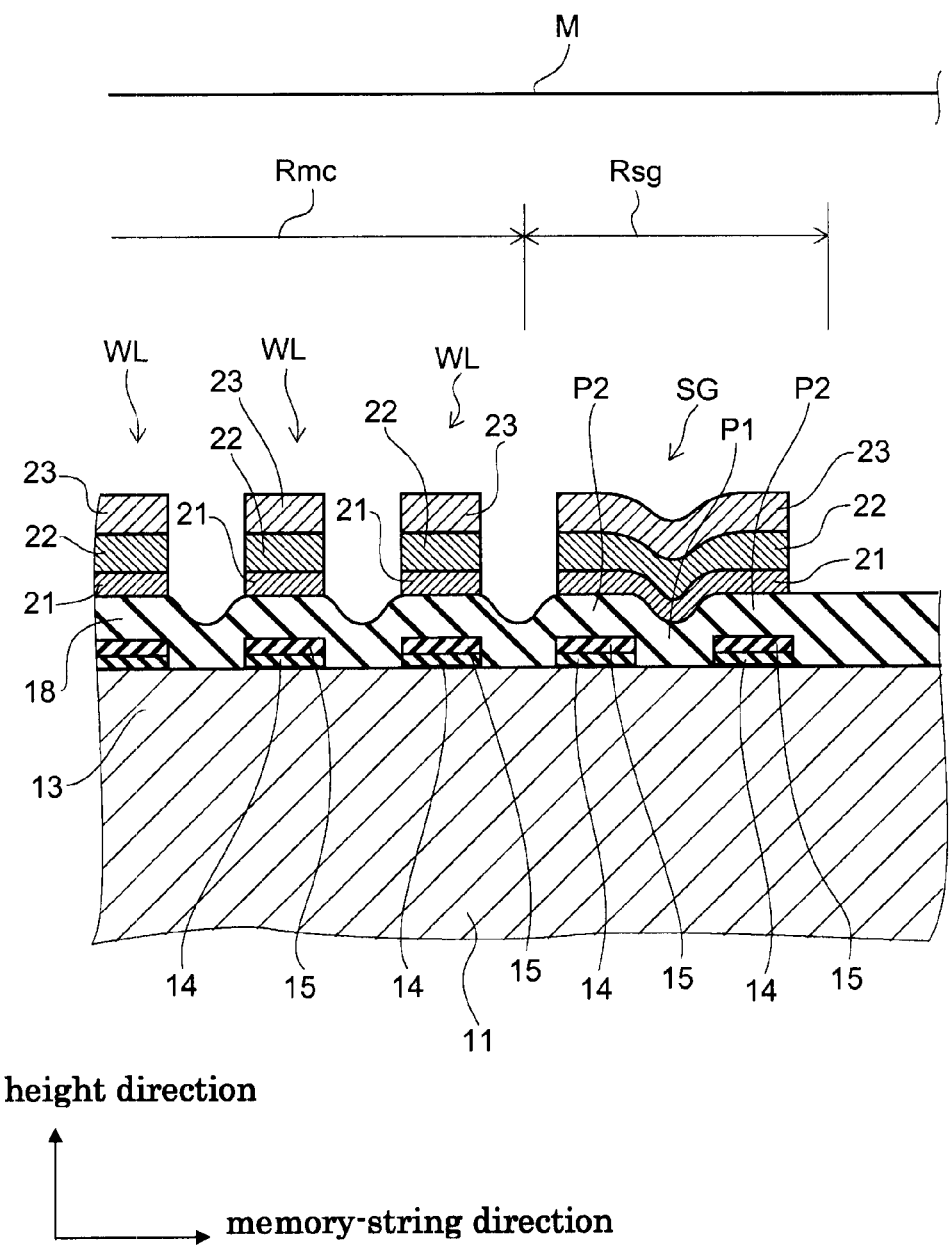
FIG. 13 is a cross-sectional view illustrating a nonvolatile semiconductor storage device according to a modification of the second embodiment.

FIG. 13 is a cross-sectional view illustrating a nonvolatile semiconductor storage device according to the present modification.

Note that the peripheral circuit part C which is not shown in FIG. 13 has the same configuration as that shown in FIG. 12.

As FIG. 13 shows, in the present modification, the top surface of the block insulating film 18 has dips and bumps that reflect the arrangement of the tunnel insulating films 14 and the charge storage films 15. In this case, parts of the block insulating film 18 that correspond to the first portions P1 in the gate insulating films for the select gate transistors has a physical thickness smaller than parts thereof that correspond to the second portions P2, by the thickness of the laminated film of the tunnel insulating film 14 and the charge storage film 15. This effect can also contribute to a further improvement in the characteristics of the select gate transistors. Configurations, operations, and effects of the present modification other than those described above are the same as the second embodiment.

The present invention has been described above through the embodiments, but the present invention is not limited to those embodiments. The scope of the present invention includes modifications of the above embodiments made by those skilled in the art as long as they have the gist of the present invention, the modifications being obtained by appropriately adding a constituent, omitting a constituent, or making a design modification to a constituent, or adding a step, omitting a step, or changing a condition for a step. For example, the charge storage films 15 may not have to be formed only in areas immediately above the semiconductor portions 13 and immediately below the word electrodes WL as long as the charge storage films 15 are split for each memory cell. In other words, the charge storage films 15 may stick out of the areas immediately below the word electrodes WL, or may be shifted relative to the word electrodes WL.

What is claimed is:

1. A nonvolatile semiconductor storage device comprising:
a semiconductor substrate;
a plurality of device isolation regions being disposed in an upper-layer portion of the semiconductor substrate, and dividing the upper-layer portion into a plurality of semiconductor portions extending in a first direction;
a plurality of charge storage films which are disposed on one of the plurality of semiconductor portions and spaced apart from one another in the first direction;
a block insulating film disposed covering the plurality of charge storage films; and
a word electrode disposed on the block insulating film for each of rows of the plurality of charge storage films arranged in a second direction intersecting the first direction,
wherein the block insulating film is disposed continuously in the first direction and in the second direction.

2. The nonvolatile semiconductor storage device according to claim 1, wherein the plurality of charge storage films are spaced apart from one another in the second direction.

3. The nonvolatile semiconductor storage device according to claim 2, wherein tunnel insulating films are disposed between the plurality of charge storage films and the semiconductor portions.

4. The nonvolatile semiconductor storage device according to claim 1, wherein the block insulating film is formed of a material having a dielectric constant higher than a material forming the charge storage films.

5. The nonvolatile semiconductor storage device according to claim 1, further comprising a select gate electrode, wherein the charge storage films are not arranged between the semiconductor portions and the select gate electrode.

6. The nonvolatile semiconductor storage device according to claim 5, further comprising a barrier film disposed between semiconductor portions and the select gate electrode and covered by the block insulating film.

7. The nonvolatile semiconductor storage device according to claim 1, further comprising a select gate electrode, wherein
the charge storage films are arranged between the semiconductor portions and the select gate electrode, and
all of the charge storage films are arranged at regular intervals in the first direction.

8. The nonvolatile semiconductor storage device according to claim 1, further comprising a low voltage transistor, wherein
the low voltage transistor includes: a gate insulating film in contact with top surfaces of the semiconductor portions; and a gate electrode in contact with a top surface of the gate insulating film.

9. The nonvolatile semiconductor storage device according to claim 1, wherein a top surface of each of the plurality of device isolation regions is lower than a top surface of the block insulating film.

10. The nonvolatile semiconductor storage device according to claim 1, wherein a top surface of the block insulating film between the plurality of charge storage films is lower than a top surface of the block insulating film above the charge storage films.

* * * * *